US009502320B2

(12) United States Patent
Katsuki

(10) Patent No.: US 9,502,320 B2
(45) Date of Patent: Nov. 22, 2016

(54) SEMICONDUCTOR DEVICE
(71) Applicant: FUJI ELECTRIC CO., LTD., Kawasaki-shi, Kanagawa (JP)
(72) Inventor: Takashi Katsuki, Matsumoto (JP)
(73) Assignee: FUJI ELECTRIC CO., LTD., Kawasaki-Shi (JP)
( * ) Notice: Subject to any disclaimer, the term of this patent is extended or adjusted under 35 U.S.C. 154(b) by 0 days.
(21) Appl. No.: 14/933,634
(22) Filed: Nov. 5, 2015
(65) Prior Publication Data
US 2016/0148853 A1 May 26, 2016
(30) Foreign Application Priority Data Nov. 21, 2014 (JP) ................. 2014-236799

(51) Int. Cl.
*H01L 23/08* (2006.01)
*H01L 23/057* (2006.01)
*H01L 23/31* (2006.01)
*H01L 23/29* (2006.01)
*H01L 23/492* (2006.01)
(52) U.S. Cl.
CPC ............. *H01L 23/057* (2013.01); *H01L 23/08* (2013.01); *H01L 23/293* (2013.01); *H01L 23/3107* (2013.01); *H01L 23/492* (2013.01)
(58) Field of Classification Search
None
See application file for complete search history.

(56) References Cited

U.S. PATENT DOCUMENTS

| | | | | | |
|---|---|---|---|---|---|
| 6,492,203 | B1* | 12/2002 | Wakashima | ........ | H01L 21/4803 257/E23.004 |
| 2004/0079957 | A1* | 4/2004 | Andrews | ............... | H01L 33/486 257/100 |
| 2004/0102023 | A1* | 5/2004 | Morozumi | .......... | H01L 23/3735 438/460 |
| 2005/0072547 | A1* | 4/2005 | Osanai | ................. | C04B 41/009 164/98 |
| 2006/0057768 | A1* | 3/2006 | Nakanishi | ........... | H01L 23/3732 438/106 |
| 2006/0108601 | A1* | 5/2006 | Okamoto | .................. | C23C 4/02 257/177 |
| 2009/0108473 | A1* | 4/2009 | Wang | ....................... | H01L 23/13 257/783 |
| 2011/0309512 | A1* | 12/2011 | Gejima | ................. | H01L 23/053 257/771 |
| 2011/0309527 | A1* | 12/2011 | Okamoto | .............. | H01L 21/565 257/782 |
| 2012/0228503 | A1* | 9/2012 | Nishikawa | ................ | G01J 5/04 250/338.3 |
| 2014/0299982 | A1* | 10/2014 | Minamio | .............. | H01L 25/162 257/712 |
| 2014/0312464 | A1 | 10/2014 | Onishi et al. | | |
| 2014/0327024 | A1* | 11/2014 | Ishihara | .................. | H01L 24/97 257/98 |
| 2015/0214194 | A1* | 7/2015 | Yan | .......................... | H01L 33/64 257/88 |
| 2015/0262927 | A1* | 9/2015 | Kang | .................. | H01L 23/3121 361/761 |
| 2016/0027709 | A1* | 1/2016 | Okamoto | ................ | H01L 23/08 257/693 |

FOREIGN PATENT DOCUMENTS

| | | |
|---|---|---|
| JP | 2009-064806 A | 3/2009 |
| JP | 2011-249786 A | 12/2011 |
| JP | 2013-165125 A | 8/2013 |
| JP | 3191112 U | 6/2014 |
| JP | 2014-212218 A | 11/2014 |

* cited by examiner

*Primary Examiner* — Michael Lebentritt
(74) *Attorney, Agent, or Firm* — Manabu Kanesaka

(57) ABSTRACT

A semiconductor device includes an insulating substrate including a metal plate, an insulating plate, and a circuit plate laminated sequentially in order; a semiconductor element fixed to the circuit plate; a wiring member connected to an electrode provided on a surface of the semiconductor element, the circuit plate, or the electrode and the circuit plate; a plastic housing having a hollow shape to receive the insulating substrate, the semiconductor element, and the wiring member therein, the plastic housing having an inner frame on an inner surface and a step formed in a front end of the inner frame; and a sealing material made of a thermosetting resin to seal the insulating substrate, the semiconductor element, and the wiring member inside the plastic housing.

5 Claims, 6 Drawing Sheets

SEMICONDUCTOR DEVICE

CROSS-REFERENCES TO RELATED APPLICATIONS

The present application claims priority from Japanese Application No. 2014-236799 filed Nov. 21, 2014, the disclosure of which is incorporated herein.

BACKGROUND OF THE INVENTION

Field of the Invention

The present invention relates to a semiconductor device.

Description of the Background Art

Electronization of motor vehicles as represented by hybrid electric vehicles (HEVs) or electric vehicles (EVs) has advanced recently. Power semiconductor modules have been used for conversion of electric power of these hybrid electric vehicles or electric vehicles.

As one of such power semiconductor modules, there has been known a power semiconductor module in which at least one power semiconductor element (semiconductor chip) is fixed to a circuit plate of an insulating substrate and built in a plastic housing. For example, the plastic housing is made of a PPS resin (polyphenylene sulfide resin). The plastic housing has a hollow shape and a conductive member connecting to the outside is provided integrally with the plastic housing by insert molding. The conductive member is electrically connected to an electrode on the semiconductor chip or the circuit plate of the insulating substrate inside the plastic housing through a wiring member such as a bonding wire. The insulating substrate, the semiconductor chip and the wiring member inside the plastic housing are sealed by a sealing material made of a thermosetting resin. The sealing material made of an epoxy resin etc. serves for protecting and insulating the semiconductor chip, the bonding wire, etc. received in the plastic housing.

However, due to the kind of the resin of the plastic housing, the sealing material made of the thermosetting resin has a poor adhesion property to a resin portion of the plastic housing and a difference in linear expansion coefficient between the resin portion of the plastic housing and the sealing material is large. Accordingly, thermal stress may occur between the plastic housing and the sealing material due to repetition of generation of heat when the semiconductor chip is operated or due to the change of the ambient temperature. As a result, there is a possibility that the sealing material and the resin portion of the plastic housing may be separated in the interface therebetween. There is also a possibility that the progress of the separation between the sealing material and the resin portion of the plastic housing may affect the joining state of the bonding wire or the electrical insulation property of an internal circuit.

There is a semiconductor module in which corners in the fringe of a metal plate of an insulating substrate are curved in order to improve adhesive force between the metal plate and a mold resin (Patent Literature 1). In addition, there is a semiconductor package in which protrusions each being shaped like a quadrangular truncated pyramid are formed in at least a portion of a lead frame in order to improve the adhesion property between a sealing resin and leads (Patent Literature 2). Further, there is a package for a semiconductor light-emitting device in which a scratch index of a resin molded article is set to be not larger than a predetermined numerical value in order to suppress separation between the resin molded article for the package and a sealing material (Patent Literature 3).

CITATION LIST

Patent Document

Patent Literature 1: Japanese Unexamined Patent Application Publication No. JP-A-2009-064806
Patent Literature 2: Japanese Unexamined Patent Application Publication No. JP-A-2013-165125
Patent Literature 3: Japanese Unexamined Patent Application Publication No. JP-A-2011-249786

However, Patent Literature 1 and Patent Literature 2 are not effective in improvement of separation between the sealing material and the plastic housing. In Patent Literature 3, the resin of the resin molded article for the package is cured by a filler so it cannot be applied to a typical plastic housing containing no filler.

SUMMARY OF THE INVENTION

In order to advantageously solve the foregoing problem of the semiconductor device inherent in the conventional art, an object of the invention is to provide a semiconductor device in which separation between a sealing material and a resin portion of a plastic housing is suppressed to thereby attain high long-term reliability.

In order to achieve the aforementioned object, the following semiconductor device is provided.

The semiconductor device according to the invention includes: an insulating substrate which is formed by laminating a metal plate, an insulating plate and a circuit plate sequentially; a semiconductor element which is fixed to the circuit plate; a wiring member which is connected to either an electrode provided in a surface of the semiconductor element or the circuit plate, or both; a plastic housing which is formed into a hollow shape to receive the insulating substrate, the semiconductor element and the wiring member therein; and a sealing material which is made of a thermosetting resin to seal the insulating substrate, the semiconductor element and the wiring member inside the plastic housing. The plastic housing has an inner frame in its inner surface and a step is formed in a front end of the inner frame.

In the semiconductor device according to the invention, the step is formed in the front end of the inner frame in the plastic housing having the inner frame. Accordingly, separation between the sealing material and a resin portion of the plastic housing can be suppressed by the step so that the semiconductor device with high long-term reliability can be attained.

DETAILED DESCRIPTION OF THE INVENTION

A semiconductor device according to an embodiment of the invention will be described specifically with reference to the drawings.

Figure 1:
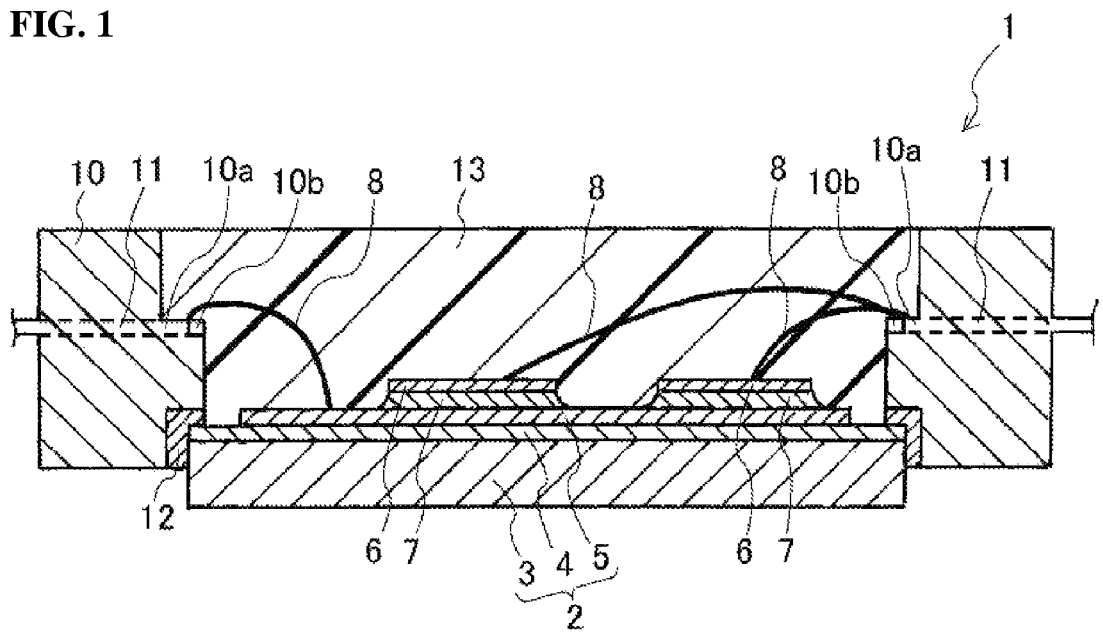
FIG. 1 is a sectional view of a power semiconductor module according to an embodiment of the invention.

FIG. 1 shows a sectional view of a power semiconductor module as a semiconductor device according to Embodiment 1 of the invention. The power semiconductor module 1 shown in FIG. 1 is provided with an insulating substrate 2, semiconductor chips 6, bonding wires 8, a plastic housing 10, and a sealing material 13. Incidentally, in the following description, the expression "upper" or "lower" indicates an upper or lower position shown on the drawings for convenience of explanation.

The insulating substrate 2 includes a metal plate 3, an insulating plate 4 laminated on one surface of the metal plate 3, and a circuit plate 5 laminated on the insulating plate 4. The metal plate 3 is made of a metal material with good thermal conductivity, such as aluminum, an aluminum alloy, copper, or a copper alloy. In addition, for example, the insulating plate 4 is made of an insulating resin. In this case, there is no particular limit on the material of the insulating plate 4 as long as it is a resin having an electrical insulation property. However, a resin with good thermal conductivity is preferably used as the material of the insulating plate 4 in order to radiate heat from the semiconductor chips 6. Specifically, a liquid crystal polymer serving as a material with good thermal conductivity, an epoxy resin serving as the same material as that of the sealing material 13 as will be described later, etc. can be used for the insulating plate 4 of the insulating substrate 2. These resins can be coated on the metal plate 3 to form the insulating plate 4.

The circuit plate 5 of the insulating substrate 2 is made of a metal material with good electric conductivity, such as copper or a copper alloy. The circuit plate 5 of the insulating substrate 2 is selectively formed on one surface of the insulating plate 4 so as to form a predetermined circuit. The semiconductor chips 6 are joined to one surface of the circuit plate 5, for example, through a solder 7 serving as a joining material. In addition, one end of each of the bonding wires 8 serving as wiring members is joined. Moreover, any other electric component such as a capacitor chip may be joined to the one surface of the circuit plate 5.

For example, each semiconductor chip 6 is a diode chip, a power MOSFET chip, or an IGBT (Insulated Gate Bipolar Transistor) chip. Particularly, the kind of the semiconductor chip is not limited. In addition, silicon carbide (SiC), gallium nitride (GaN) in addition to single crystal silicon may be used as the substrate of the semiconductor chip 6. When the plurality of semiconductor chips 6 is provided on the circuit plate 5 of the insulating substrate 2, the semiconductor chips 6 may be the same kind of semiconductor chips or a combination of different kinds of semiconductor chips. When each semiconductor chip 6 is a vertical semiconductor element, electrodes are provided on two principal surfaces facing each other respectively. One of the electrodes provided on one of the principal surfaces is electrically and mechanically connected to the circuit plate 5 through the solder 7. One end of a corresponding one of the bonding wires 8 is joined to the other electrode provided on the other principal surface. Incidentally, each semiconductor chip 6 is not limited to the vertical semiconductor element but may be a horizontal semiconductor element.

Each bonding wire 8 is made of a conductive thin wire made of aluminum, an aluminum alloy, etc. However, the wiring member is not limited to the bonding wire 8 but may be, for example, a bus bar or may be a combination of a conductive post and a wiring board.

The insulating substrate 2, the semiconductor chips 6 and the bonding wires 8 are received in the casing 10 serving as a plastic housing. The casing 10 is substantially shaped like a hollow rectangular parallelepiped (frame body). An upper end portion of the casing 10 is formed as an opening so that the sealing material 13 can be injected into the hollow space inside the casing 10 through the upper end portion. In addition, the casing 10 is provided with leads 11 each serving as a conductive member for electrically connecting to the outside. In the power semiconductor module 1 according to the embodiment, the leads 11 are provided to extend from an inner surface side of the casing 10 and protrude outward from an outer surface of the casing 10 so that one end of each of the leads 11 can appear outward from the outer surface of the casing 10. In the inner surface side of the casing 10, the other ends of the leads 11 are joined to the other ends of the bonding wires 8 joined to the semiconductor chips 6 or the circuit plate 5 of the insulating substrate 2.

The casing 10 is made of an insulating resin etc. An example of the insulating resin is a polyphenylene sulfide resin. A lower end portion of the casing 10 is joined to a fringe portion of the metal plate 3 and the insulating plate 4 of the insulating substrate 2 by an adhesive agent 12 such as an insulating adhesive agent. In this manner, an electrical insulation property between the insulating substrate 2 and the casing 10 can be ensured. At the same time, any gap between the insulating substrate 2 and the casing 10 can be eliminated so that the sealing material 13 can be prevented from leaking to the outside through the gap.

The hollow space is filled with the sealing material 13 from the upper end of the casing 10 so that the circuit plate 5 of the insulating substrate 2, the semiconductor chips 6 and the bonding wires 8 can be sealed. A thermosetting resin such as an epoxy resin is high in electric insulation property. Therefore, such a thermosetting resin is preferably used as the sealing material 13.

The casing 10 has an inner frame 10a. The inner frame 10a is provided in the inner surface side of the casing 10 so as to protrude more inward between the upper end and the lower end of the casing 10. The inner frame 10a overhangs inward than the opening of the casing 10. The thickness of the casing 10, i.e. the distance between the inner surface and the outer surface of the casing 10, in the inner frame 10a is thicker than the thickness of the casing 10 in the upper end of the casing 10.

The leads 11 are formed integrally with the casing 10 by insert molding. One end portion of each of the leads 11 on the inner surface side of the casing 10 extends inward from the casing 10 by the same length as the length with which the inner frame 10a protrudes from the inner surface of the casing 10. In addition, the one end portion of each of the leads 11 is fixed so as to be exposed in an upper surface of the inner frame 10a. The bonding wire is connected to the one end portion of each of the leads 11 which is exposed in the upper surface of the inner frame 10a.

Figure 2:
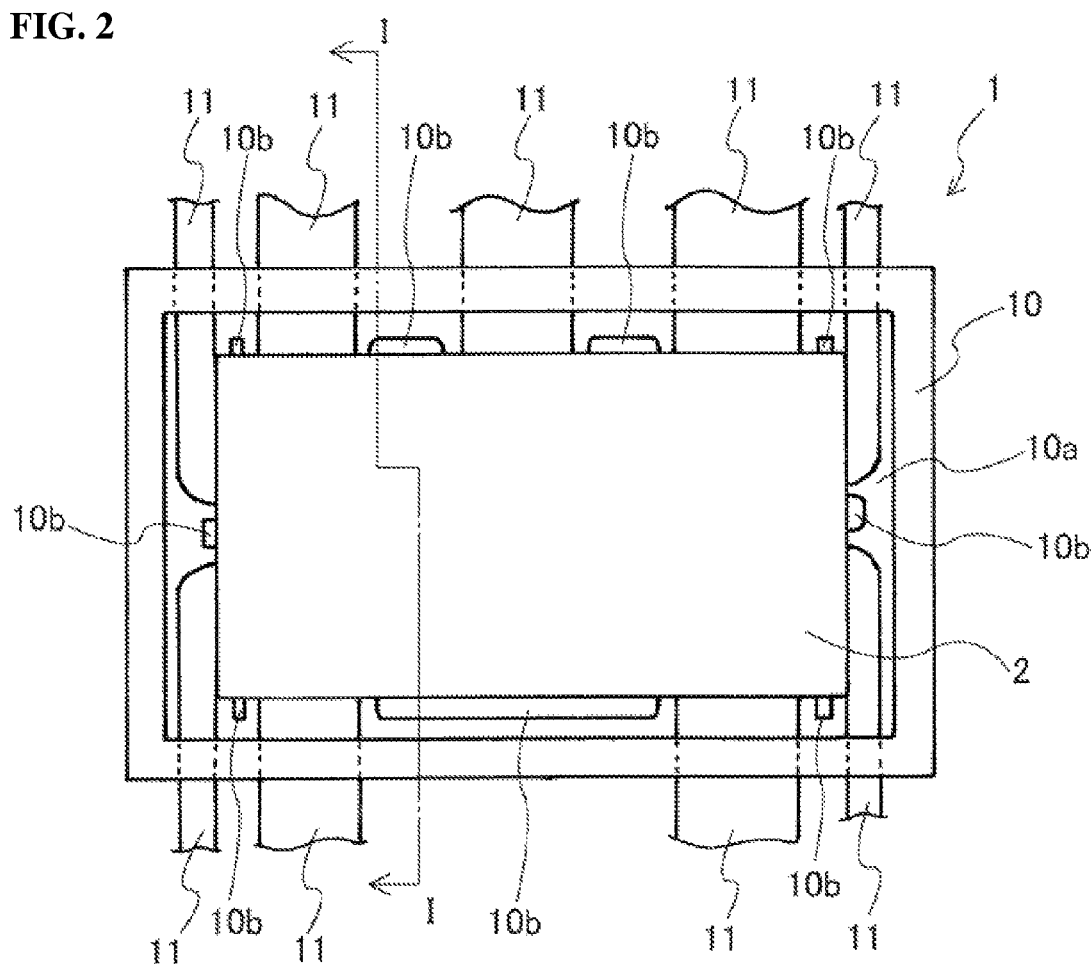
FIG. 2 is a plan view of the power semiconductor module shown in FIG. 1.

FIG. 2 shows a plan view of the power semiconductor module 1 shown in FIG. 1. FIG. 1 is a sectional view along the line I-I in FIG. 2 viewed from the arrow direction. The invention is characterized by the shape of the inner frame 10a. For easier understanding of the invention, illustrations of the circuit plate 5 of the insulating substrate 2, the semiconductor chips 6, and the bonding wires 8 are omitted in FIG. 2.

In FIG. 2, the inner frame 10a is formed in four inner side surfaces of the casing 10. The inner frames 10a may also be formed in two inner side surfaces of the casing 10 on opposite long sides.

As a characteristic structure of the power semiconductor module according to the embodiment, steps 10b are formed in the front end of the inner frame 10a protruding inward from the inner surface of the casing 10. In the embodiment, the steps 10b are formed in corner portions of the upper surface of the inner frame 10a. In addition, each of the steps 10b is formed between adjacent ones of the leads 11 to avoid the leads 11 attached to the inner frame 10a.

Since the steps 10b are formed in the front end of the inner frame 10a, deformation between the resin of the casing 10 and the sealing material 13 in the places of the steps 10b can be suppressed. In addition, the steps 10b can generate an anchor effect for anchoring the sealing material 13 to the resin of the casing 10. From these points, it can be considered that separation between the casing 10 and the sealing material 13 can be suppressed.

Separation is likely to occur when, for example, the resin of the casing 10 which is a polyphenylene sulfide resin and the sealing material 13 which is an epoxy resin are used in combination. Accordingly, formation of the steps 10b in the case where the resins are used in combination is effective in suppressing separation.

Separation between the casing 10 and the sealing material 13 occurs from the front end of the inner frame 10a. Accordingly, when the steps 10b are formed in the front end of the inner frame 10a where separation may occur, separation between the casing 10 and the sealing material 13 can be suppressed effectively.

When a heat cycle is applied to the power semiconductor module 1 after the resin of the sealing material 13 is injected into the casing 10 and cured, separation starting from the front end portion in the upper surface of the inner frame 10a propagates. Accordingly, it is preferable that the steps 10b are formed in the front end of the same surface of the inner frame 10a to which the leads 11 are attached, that is, in the front end of the upper surface of the inner frame 10a. According to the research of the present inventor, it has been confirmed that the separation suppressing effect in the case where the steps 10b are formed in the front end of the lower surface of the inner frame 10a is less sufficient than that in the case where the steps 10b are formed in the front end of the upper surface of the inner frame 10a.

In addition, the adhesion property of the leads 11 attached to the inner frame 10a of the casing 10 to the sealing material 13 is better than the adhesion property of the resin of the casing 10 to the sealing material 13. Accordingly, separation is more likely to occur in the vicinities of the centers between adjacent ones of the leads 11 than the interfaces between the leads 11 and the sealing material 13. Thus, each of the steps 10b is formed between adjacent ones of the leads 11 in the upper surface of the inner frame 10a so that separation can be suppressed effectively.

Figure 3:
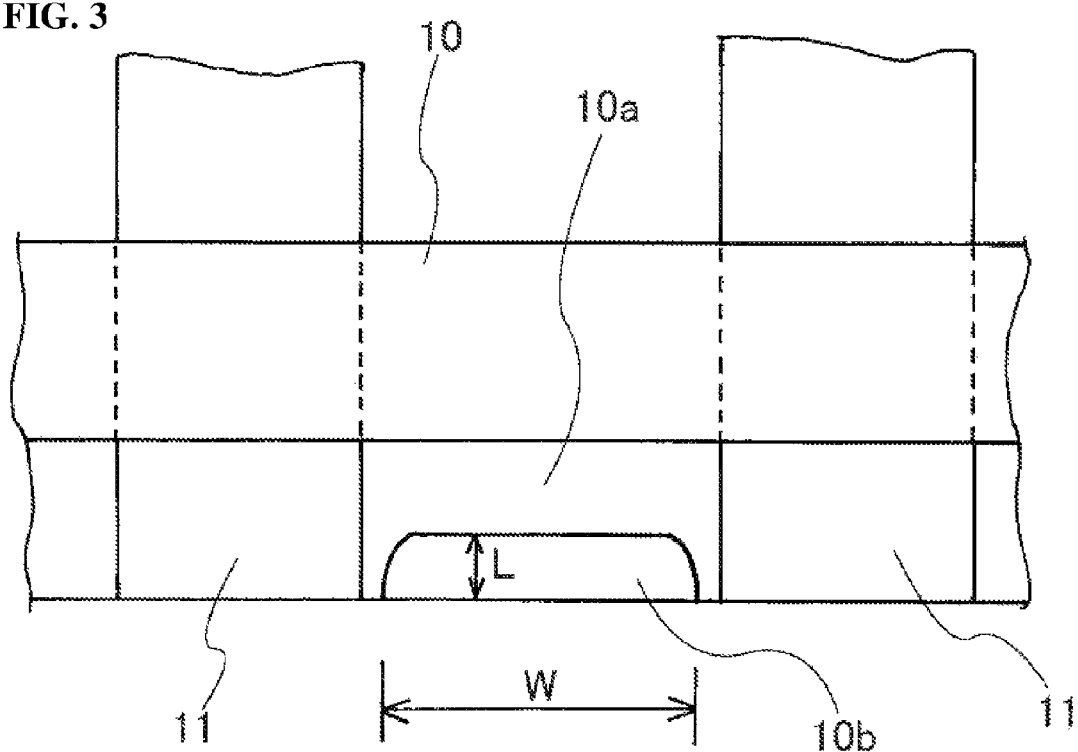
FIG. 3 is a partially enlarged view of FIG. 2.

FIG. 3 is a partially enlarged view of the upper surface of the inner frame 10a of the casing 10. Each of the steps 10b is formed in the front end of the inner frame 10a so as to be placed between adjacent ones of the leads 11 and substantially at equal distances from the leads 11 respectively. It is preferable that the width W of the step 10b is about 50% to 80% of the width of a resin region between the adjacent ones of the leads 11. When the width W of the step 10b is in a range of about 50% to 80% of the width of the resin region between the adjacent ones of the leads 11, separation can be suppressed effectively.

It is preferable that the length L of the step 10b in a direction along the protrusion direction of the inner frame 10a is about 25% to 50% of the length of the inner frame 10a protruding from the inner surface of the casing 10. When the length L of the step 10b is about 25% to 50% of the length of the inner frame 10a protruding from the inner surface of the casing 10, separation can be suppressed effectively.

The height of the step 10b can be set to be substantially not larger than the thickness of each of the leads 11. For example, the height of the step 10b is not larger than 0.5 mm.

Figure 4:
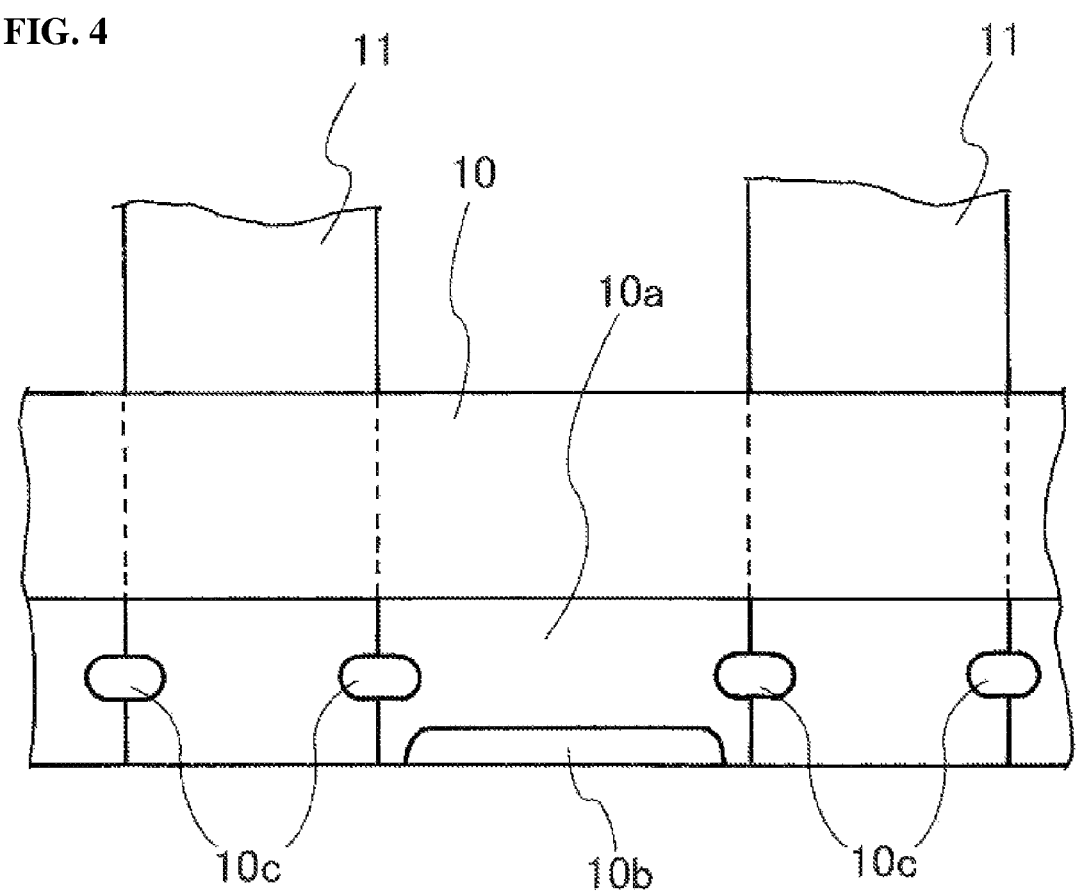
FIG. 4 is a partially enlarged plan view of a modification.

FIG. 4 is a partially enlarged view of an upper surface of an inner frame 10a of a casing 10 in a modification of the power semiconductor module 1 according to the embodiment, correspondingly to the partially enlarged view shown in FIG. 3. In the example shown in FIG. 4, lead pressers 10c are provided in side edges of each lead 11. The lead pressers 10c are made of the same resin as that of the casing 10. The lead pressers 10c are formed simultaneously when the casing 10 and the leads 11 are formed by insert molding. The lead pressers 10c are formed to firmly fix the leads 11 to the inner frame 10a.

In the example shown in FIG. 4 in which the lead pressers 10c are provided, the step 10b is formed so as not to interfere with the lead pressers 10c. Therefore, the aforementioned width W of the step 10b and the aforementioned length L of the step 10b are set at dimensions in their suitable ranges so as not to interfere with the lead pressers 10c. The lead pressers 10c may be connected to their adjacent lead pressers 10c so as not to interfere with the step 10b.

Figure 5A:
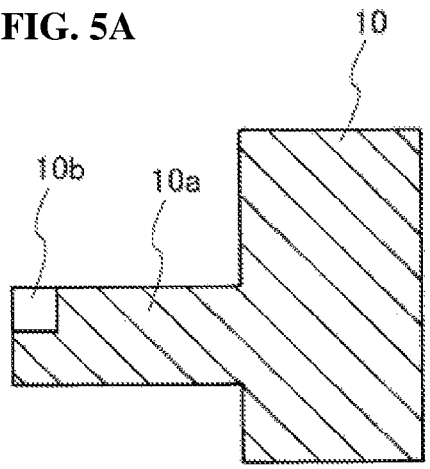
FIGS. 5A to 5D are enlarged sectional views of the vicinity of a step.
Figure 5B:
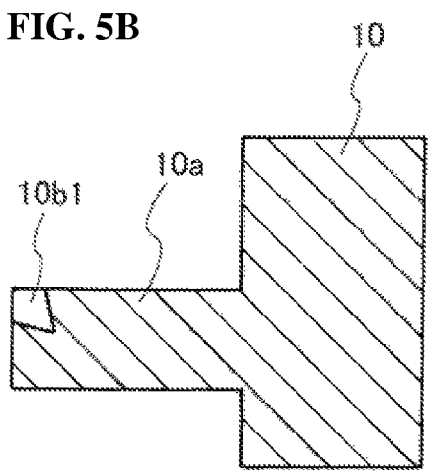
Figure 5C:
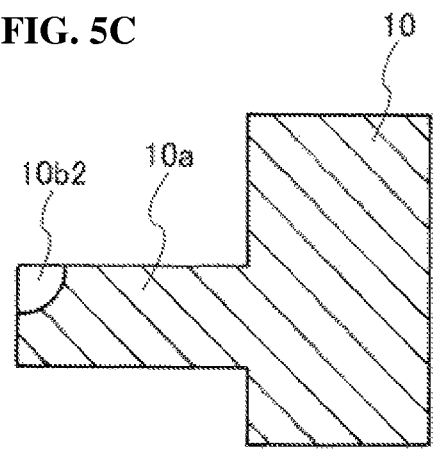
Figure 5D:
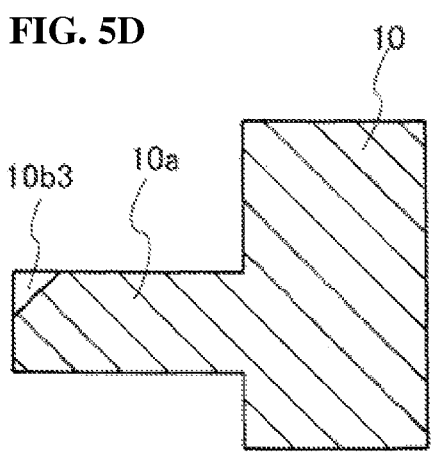

FIGS. 5A to 5D are enlarged sectional views of the vicinity of the step 10b. FIG. 5A is a sectional view of the step 10b according to the embodiment shown in FIG. 1. FIGS. 5B to 5D are modifications of the step 10b.

Incidentally, in FIGS. 5A to 5D, the height of the step 10b relative to the height of the inner frame is drawn in a larger ratio than a real ratio in order to make it easy to understand the invention.

The step 10b in FIG. 5A is constituted by two planes perpendicular to each other. When the step 10b is constituted by the two planes perpendicular to each other, the anchor effect for anchoring the sealing material 13 to the resin of the casing 10 is large in the vicinity of the line of intersection of the two planes. Accordingly, the separation suppressing effect is large. Thus, the step 10b having the sectional shape shown in FIG. 5A is a preferable shape.

A step 10b1 shown in FIG. 5B is a modification 1 in which two planes forming the step intersect with each other at an acute angle. The anchor effect for anchoring the sealing material 13 to the resin of the casing 10 is large in the vicinity of the line of intersection of the two planes in the step 10b1. Accordingly, the separation suppressing effect is large.

In addition to the modification 1 shown in FIG. 5B, the step may be formed alternatively in such a manner that the two planes forming the step 10b intersect with each other at an obtuse angle. The step having the structure can also suppress separation. It is a matter of course that the steps shown in FIG. 5A and FIG. 5B are better in the anchor effect and also better in the separation suppressing effect than the step constituted by the two planes intersecting with each other at the obtuse angle. The section of each of the step 10b and the step 10b1 is corrugated. Due to the step which is corrugated in section and which is provided between adjacent ones of the leads 11, strength against bending can be enhanced. A W-shape step having three corners in section similarly to the step 10b and the step 10b1 is preferable.

A step 10b2 shown in FIG. 5C is a modification 2 in which the step is constituted by a curved surface. The step 10b2 shown in FIG. 5C can also suppress separation.

A step 10b3 shown in FIG. 5D is an example in which the step is constituted by an inclined surface. The step 10b3 shown in FIG. 5D can also suppress separation.

Embodiment 2

Next, a power semiconductor module according to Embodiment 2 of the invention will be described. The power semiconductor module according to the embodiment has steps 10b in a front end of an inner frame 10a in a similar manner to the aforementioned power semiconductor module 1 according to Embodiment 1. In addition thereto, the surface of the inner frame 10a in the power semiconductor module according to the embodiment is roughened.

When the surface of the inner frame 10a is roughened, there is an anchor effect for anchoring a sealing material 13 so that an effect for suppressing separation between a resin of the inner frame 10a and the sealing material 13 can be improved more greatly. The degree of surface roughness is specifically not lower than 1.0 µm in terms of arithmetic average roughness Ra. When the degree of surface roughness is not lower than 1.0 µm, improvement of the separation suppression effect achieved by the surface roughness is large.

Among the surfaces of the inner frame 10a, an upper surface of the inner frame 10a is preferably roughened. Since the steps 10b are formed in front end portions of the upper surface of the inner frame 10a, separation can be suppressed more greatly by the steps 10b and the roughened upper surface of the inner frame 10a.

Incidentally, not only the upper surface of the inner frame 10a but also the other surfaces of the inner frame may be roughened.

For example, shot blasting can be used as a surface roughening method.

Figure 6:
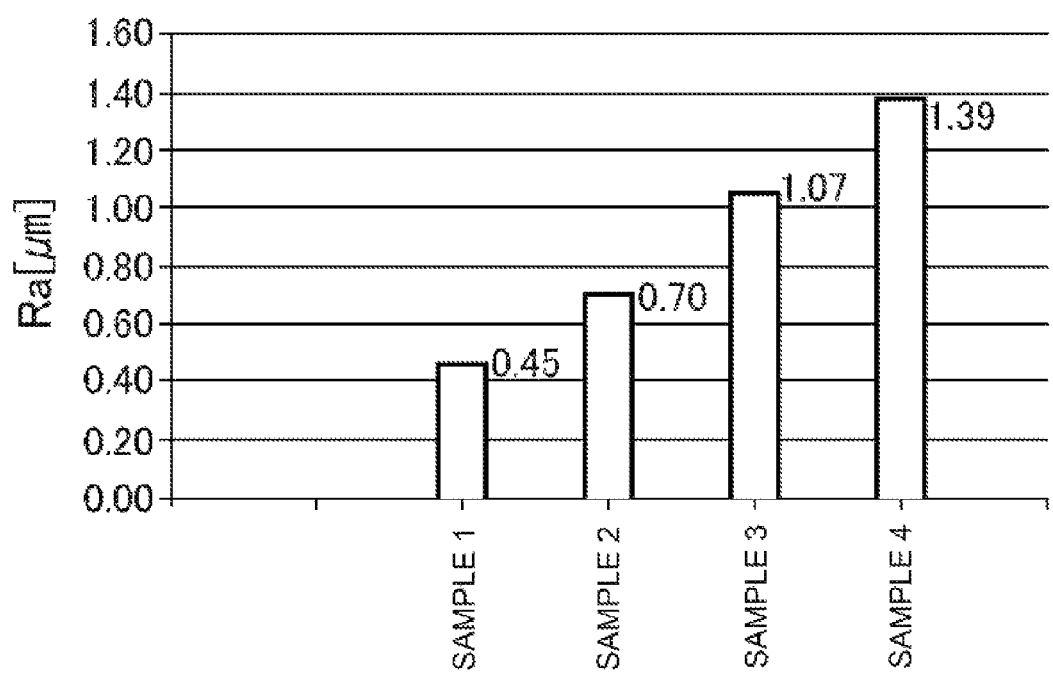
FIG. 6 is a graph showing arithmetic average roughness in surfaces of casings as to samples subjected to different blasting pressures.

FIG. 6 is a graph showing measurement results of arithmetic average roughness of the surfaces of the casings 10 as to Samples 1 to 4 in which the upper surfaces of the inner frames 10a of the casings 10 having the steps 10b formed in the front ends of the inner frames 10a were roughened by shot blasting under various blasting pressures. The blasting pressure applied to Sample 2 was higher than that applied to Sample 1. The blasting pressure applied to Sample 3 was higher than that applied to Sample 2. The blasting pressure applied to Sample 4 was higher than that applied to Sample 3. As apparent from FIG. 6, the surface can be roughened more greatly as the blasting pressure increases.

Occurrence of separation between the casing 10 and the sealing material 13 in the power semiconductor module provided with the casing 10 in each of Samples 1 to 4 was investigated. As a result, Sample 3 and Sample 4 having arithmetic average roughness Ra not lower than 1.0 µm had a large separation suppression effect.

Accordingly, separation can be suppressed more effectively in the power semiconductor module provided with the casing 10 which has been subjected to shot blasting treatment under selected blasting pressure to have arithmetic average roughness Ra not lower than 1.0 µm.

For example, zirconia having a particle size of about 50 µm can be used as a projection material during the shot blasting treatment. The shot blasting treatment may be applied to the inner surface of the casing 10 after insert molding in order to roughen the surface of the inner frame or may be applied to a portion corresponding to the inner frame in a mold used for insert molding.

In addition, the surface roughening method is not limited to shot blasting but may be performed in such a manner that the surface of the mold is roughened by electric discharge machining or chemical machining.

The semiconductor device according to the invention has been described in conjunction with the embodiments and the drawings. However, the semiconductor device according to the invention is not limited to the description of the embodiments and the drawings, but many modifications may be made without departing from the spirit and scope of the invention.

What is claimed is:

1. A semiconductor device comprising:
   an insulating substrate including a metal plate, an insulating plate, and a circuit plate laminated sequentially in order;
   a semiconductor element fixed to the circuit plate;
   a wiring member connected to an electrode provided on a surface of the semiconductor element, the circuit plate, or the electrode and the circuit plate;
   a plastic housing having a hollow shape to receive the insulating substrate, the semiconductor element, and the wiring member therein, the plastic housing having an inner frame on an inner surface and a step formed in a front end of the inner frame; and
   a sealing material made of a thermosetting resin to seal the insulating substrate, the semiconductor element, and the wiring member inside the plastic housing.

2. The semiconductor device according to claim 1, wherein the step is formed in an upper surface of the inner frame.

3. The semiconductor device according to claim 1, further comprising:
   a plurality of conductive members each extending from an inner side of the plastic housing toward an outer side of the plastic housing;
   wherein one end of each of the conductive members is disposed on the inner frame, and the step is formed between the conductive members.

4. The semiconductor device according to claim 1, wherein the plastic housing is made of a polyphenylene sulfide resin, and the sealing material is made of an epoxy resin.

5. The semiconductor device according to claim 1, wherein an upper surface of the inner frame is roughened to be not lower than 1.0 µm in arithmetic average roughness Ra.

* * * * *